United States Patent
Beyer et al.

(10) Patent No.: US 8,536,036 B2
(45) Date of Patent: Sep. 17, 2013

(54) PREDOPED SEMICONDUCTOR MATERIAL FOR A HIGH-K METAL GATE ELECTRODE STRUCTURE OF P- AND N-CHANNEL TRANSISTORS

(75) Inventors: Sven Beyer, Dresden (DE); Jan Hoentschel, Dresden (DE); Uwe Griebenow, Markkleeberg (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 213 days.

(21) Appl. No.: 12/905,711

(22) Filed: Oct. 15, 2010

(65) Prior Publication Data

US 2011/0156153 A1 Jun. 30, 2011

(30) Foreign Application Priority Data

Dec. 30, 2009 (DE) .......................... 10 2009 055 395

(51) Int. Cl.
*H01L 21/425* (2006.01)
*H01L 21/28* (2006.01)
*H01L 21/44* (2006.01)

(52) U.S. Cl.
USPC ............ 438/573; 438/534; 257/369; 257/478

(58) Field of Classification Search
USPC ................. 257/369, 386, 388, 391, 392, 408, 257/410, 478; 438/199, 275, 287, 299, 533, 438/534, 573, 582, 583
See application file for complete search history.

(56) References Cited

U.S. PATENT DOCUMENTS

| | | | | |
|---|---|---|---|---|
| 5,837,601 A * | 11/1998 | Matsumoto | ................... | 438/592 |
| 6,319,804 B1 | 11/2001 | Greenlaw et al. | ............. | 438/592 |
| 6,348,382 B1 * | 2/2002 | Su et al. | ........................ | 438/275 |
| 6,432,763 B1 | 8/2002 | Yu | ............................ | 438/217 |
| 6,448,165 B1 * | 9/2002 | Yu et al. | ........................ | 438/585 |
| 7,947,591 B2 * | 5/2011 | Hsu et al. | ...................... | 438/591 |
| 2005/0186747 A1 * | 8/2005 | Amos et al. | ................... | 438/301 |
| 2006/0166424 A1 * | 7/2006 | Schaeffer et al. | ............. | 438/199 |
| 2007/0196988 A1 * | 8/2007 | Shroff et al. | .................. | 438/299 |
| 2007/0262348 A1 * | 11/2007 | Park et al. | ..................... | 257/204 |
| 2008/0224238 A1 * | 9/2008 | Kanakasabapathy et al. | ............................ | 257/411 |

OTHER PUBLICATIONS

Translation of Official Communication from German Patent Office for German Patent Application No. 10 2009 055 395.9 dated Apr. 14, 2011.

* cited by examiner

*Primary Examiner* — Fernando L Toledo
*Assistant Examiner* — Karen Kusumakar
(74) *Attorney, Agent, or Firm* — Williams, Morgan & Amerson, P.C.

(57) ABSTRACT

In a process strategy for forming high-k metal gate electrode structures in an early manufacturing phase, a predoped semiconductor material may be used in order to reduce the Schottky barrier between the semiconductor material and the conductive cap material of the gate electrode structures. Due to the substantially uniform material characteristics of the predoped semiconductor material, any patterning-related non-uniformities during the complex patterning process of the gate electrode structures may be reduced. The predoped semiconductor material may be used for gate electrode structures of complementary transistors.

20 Claims, 5 Drawing Sheets

PREDOPED SEMICONDUCTOR MATERIAL FOR A HIGH-K METAL GATE ELECTRODE STRUCTURE OF P- AND N-CHANNEL TRANSISTORS

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using, for instance, CMOS technology, millions of transistors, e.g., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed at an interface positioned between highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration in the drain and source regions, the mobility of the charge carriers and, for a planar transistor architecture, on the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice in the near future for circuit generations designed for mass products. One reason for the importance of silicon in fabricating semiconductor devices has been the superior characteristics of a silicon/silicon dioxide interface that allows reliable electrical insulation of different silicon regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has preferably been used as a base material for a gate insulation layer that separates the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions, to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. That is, conventionally, the thickness of the silicon dioxide layer has been correspondingly reduced to provide the required capacitance between the gate and the channel region. For example, a channel length of approximately 0.08 μm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials in combination with the high-k dielectric material. The conventional approach to incorporate P-type dopants into the gate electrode of the P-channel transistor and N-type dopants into the gate electrode of the N-channel transistor is less than desirable, since a depletion zone may form at the vicinity of the gate dielectric/polysilicon interface, which in turn may increase the effective thickness of the gate dielectric, thereby reducing the capacitive coupling.

For replacing the doped polysilicon at least at this interface, appropriate metal-containing materials may be provided to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided.

The process of fabricating a sophisticated gate electrode structure on the basis of a high-k dielectric material may require a moderately complex process sequence in order to adjust an appropriate work function for the transistors of different conductivity type and due to the fact that high-k dielectric materials and the conductive cap materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function, and thus of the threshold voltage of the transistors, since the actual adjustment of the work function may be accomplished after any high temperature processes, a complex process sequence for providing the different work function metals in critical gate openings is required.

In other very promising approaches, the sophisticated gate electrode structures having the desired work function are formed in an early manufacturing stage, while the further processing is based on many well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques.

Due to the ongoing demand for shrinking the gate length of transistors, very complex patterning regimes based on hard mask materials have typically been applied. Since a plurality of different materials are present in the complex gate layer stack, i.e., the gate insulation layer including the high-k dielectric material, a metal-containing cap layer, which, depending on the selected process strategy, may comprise two or more individual material layers, followed by the silicon material and a dielectric cap material, which may be acquired in addition to a hard mask material for appropriately patterning the gate layer stack in accordance with the design rules, the finally obtained shape and gate length may depend on any differences between the gate layer stacks of P-channel transistors and N-channel transistors. In addition to any patterning-related non-uniformities of gate electrode structures formed on the basis of a high-k dielectric material in combination with an electrode material including a metal-containing material and a silicon material, a certain degree of performance reduction in view of the AC behavior of sophisticated transistors has been observed, which is believed to be caused by the interface between the silicon material and the metal-containing cap layer, as will be described in more detail with reference to FIGS. 1a-1b.

FIG. 1a schematically illustrates a cross-sectional view of a semiconductor device 100, which comprises complementary transistors 150A, 150B, i.e., a P-channel transistor and an N-channel transistor, respectively, at an early manufacturing stage. As illustrated, a gate electrode structure 160A is formed on a semiconductor region or active region 102A, while a gate electrode structure 160B is formed on an active region 102B. In this context, active regions are to be understood as semiconductor regions in which are formed or are to be formed appropriate PN junctions so as to act as drain and source regions of the transistors 150A, 150B, respectively. The active regions 102A, 102B are formed in a silicon-based semiconductor layer 102, which in turn is formed above a substrate 101, which represents any appropriate carrier material, such as a semiconductor material and the like. The semiconductor layer 102 typically comprises isolation structures (not shown) which laterally delineate the active regions 102A, 102B in accordance with device requirements. Furthermore, if required, a buried insulating material (not shown) may be formed between the substrate 101 and the semiconductor layer 102, thereby forming a silicon-on-insulator (SOI) configuration. The gate electrode structures 160A, 160B typically have a similar configuration and comprise a gate insulation layer 163, which comprises a first dielectric material 161, for instance provided in the form of a silicon dioxide-based material, such as a silicon oxynitride material, with a thickness of one nanometer and less in order to not unduly contribute to a reduced capacitive coupling, as explained above. Moreover, the gate insulation layer 163 typically comprises a high-k dielectric material 162, such as hafnium oxide, zirconium oxide and the like, which may have a significantly greater dielectric constant compared to the material 161 so that, in total, a physically greater thickness of the gate insulation material 163 may be obtained, while, nevertheless, the desired high capacitive coupling is achieved. Furthermore, a metal-containing electrode material or cap material 164 is formed on the gate insulation layer 163 and is comprised of any appropriate material, such as titanium nitride and the like, possibly in combination with additional metal species, as required. Furthermore, a silicon material 165 is formed on the metal-containing cap layer 164 and, thus, the silicon material 165 may form an interface 164I with the metal-containing material 164.

Additionally, the gate electrode structure 160A comprises the dielectric cap layer 166, for instance comprised of silicon nitride, silicon dioxide and the like. Moreover, a sidewall spacer 167, such as a silicon nitride material, is formed on the sidewalls of the materials 165, 164, and 163. In principle, the gate electrode structure 160B may have substantially the same configuration, except for modifications in the gate insulation layer 163 and/or the metal-containing cap material 164 in order to obtain an appropriate effective work function of the material 164, thereby adjusting the threshold voltages of the transistors 150A, 150B. That is, as discussed above, in complex transistor elements, a dopant concentration in channel regions 151 of the transistors may be reduced in order to avoid undue charge carriers scattering and, thus, the final threshold voltages may essentially be determined by the work function of the gate electrode materials. To this end, the metal-containing cap layers 164 may have incorporated therein an appropriate metal species, such as aluminum and the like for P-channel transistors, and lanthanum and the like for N-channel transistors, which may result in the desired work function and, thus, the threshold voltage. In other approaches, an appropriate metal species may be incorporated in the gate insulation layer 163, thereby creating fixed dipole charges, which may result, in combination with the overlying metal-containing material 164, in the desired electronic characteristics. In this case, the material 164 may be selected identically for the gate electrode structures 160A, 160B, as long as the different characteristics in the gate insulation layers 163 may provide the desired threshold voltages.

The semiconductor device 100 as illustrated in FIG. 1a may be formed on the basis of any appropriate process strategy. That is, after providing the active regions 102A, 102B based on process techniques for fabricating isolation structures and providing a basic dopant concentration in the regions 102A, 102B, the gate insulation material 163 may be formed by deposition, oxidation and the like as required for providing the materials 161 and 162. Next, appropriate metal species may be formed above the active regions 102A, 102B in order to appropriately adjust the resulting work function, which may include the initiation of diffusion processes in order to diffuse specific metal species into the underlying gate insulation layer 163, while, in other cases, appropriate materials may be positioned above the gate insulation layer 163. Finally, the conductive cap material 164 is formed above the active regions 102A, 102B and may, depending on the process strategy, have the same composition or may be different for the gate electrode structures 160A, 160B. Thereafter, the silicon material 165 is deposited, followed by the deposition of a cap material 166, for instance in the form of silicon nitride and the like. Thereafter, any further materials, such as hard mask materials, for instance in the form of amorphous carbon and the like, in combination with the resist material, are provided above the resulting layer stack and are used to pattern the layer stack. For this purpose, the resist material may be used to pattern the hard mask material and the dielectric cap material 166, which is then used as an efficient mask for etching through the silicon material 165 and finally through the materials 164 and 163. Thereafter, the spacer element 167 is formed, for instance, by depositing a silicon nitride material and etching the same in order to reliably confine the materials 163 and 164, which may react very sensitively to certain process conditions and in particular to exposure to oxygen.

The further processing is then continued, for instance, by removing the cap layer 166, forming drain and source extension regions, possibly in combination with additional offset spacer elements, and finally a further sidewall spacer structure is provided in order to form drain and source regions.

FIG. 1b schematically illustrates the semiconductor device 100 in a further advanced manufacturing stage. As shown, the transistors 150A, 150B comprise drain and source regions 152, in which metal silicide regions 153 are provided to reduce the overall resistance of the transistors 150A, 150B. It should be appreciated that the drain and source regions 152 of the transistor 150A are of inverse conductivity type compared to the drain and source regions 152 of the transistor 150B. Moreover, a metal silicide 168 is also formed in the silicon material 165, thereby further enhancing overall conductivity of the gate electrode structures 160A and 160B. As explained above, the drain and source regions 152 may be formed on the basis of a sidewall spacer structure 154, which is used as an implantation mask together with the gate electrode structures 160A, 160B. Furthermore, as is well known, an appropriate masking regime is to be applied so as to implant appropriate dopant species for the transistors 150A, 150B, which may be accomplished by providing resist masks in accordance with well-established process techniques. Thereafter, high temperature processes are applied to activate the dopants and re-crystallize implantation-induced damage, thereby obtaining the final dopant profile of the drain and source regions 152. Next, the metal silicide regions 168 and 153 are formed on the basis of any appropriate silicidation sequence, wherein any appropriate material, such as nickel silicide, cobalt silicide, platinum silicide and the like, may be formed.

Upon operating the transistors 150A, 150B, it has been observed that in particular, the AC resistivity of the gate electrode structures 160A, 160B may be higher than expected, which is believed to be caused by the interface 164I between the material 164 and the polysilicon material 165. The interface 164I may represent a Schottky barrier, which may, thus, affect the high frequency behavior of the gate electrode structures 150A, 150B. Moreover, the characteristics of the interface 164I may further be deteriorated upon contact with oxygen during the entire process sequence for forming the transistors 150A, 150B, since, due to the oxygen affinity of the material 164, a certain degree of oxygen agglomeration may occur. Since, generally, the Schottky barrier may be lowered by providing a moderately high dopant concentration in the semiconductor material, it has been proposed, in addition to any dopant species introduced during the implantation sequences for forming the drain and source regions 152, to provide a certain degree of predoping of the material 165.

Again referring to FIG. 1a, as illustrated, the gate electrode structures 160A, 160B may comprise predoped areas 165A, 165B, respectively, which may be obtained on the basis of an implantation process, thereby also creating an increased dopant concentration in the vicinity of the interface 164I. As previously discussed, however, due to the doped areas 165A, 165B including dopant of different conductivity types, the resulting patterning process may be significantly influenced due to the different etch behavior of doped silicon material relative to undoped silicon material, and in particular when different types of dopants are used. For example, when adjusting the etch chemistry to suppress a substantially lateral etch rate for a non-doped or lightly doped silicon material, a pronounced lateral etch rate may occur in the doped area 165A, thereby resulting in "under etched" areas, as indicated by 165C. Similarly, different etch behavior may also be created in the doped region 165B, which may thus result in a non-uniform cross-sectional shape of each of the gate electrode structures 160A, 160B, while a difference in the shape may also occur between the gate electrode structures 160A, 160B.

Consequently, although predoping of the silicon material may result in an increased dopant concentration at the interface 164I, thereby lowering the Schottky barrier, the conventional approach may contribute to additional non-uniformities of the gate electrode structures, in particular for complementary transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which sophisticated high-k metal gate electrode structures may be provided in an early manufacturing stage, wherein an interface between a metal-containing cap material and a semiconductor-based portion of the electrode material may have an increased dopant concentration in order to significantly lower a corresponding Schottky barrier. To this end, the semiconductor material may be formed on a metal-containing cap material with a desired high dopant concentration, wherein, in some illustrative embodiments, the dopant distribution is provided in a substantially uniform manner so as to obtain substantially uniform material characteristics upon etching the semiconductor-based electrode material of the gate electrode structure. In some illustrative aspects disclosed herein, the doped semiconductor material, such as silicon, silicon/germanium and the like, may be provided for the gate electrode structures of complementary transistors so that uniform process conditions may also be achieved for the gate electrode structures of transistors of different conductivity. Consequently, by appropriately predoping the semiconductor material of the gate electrode structures, a sufficiently high dopant concentration may be preserved at the interface, even after performing subsequent implantation processes for forming drain and source extension regions and deep drain and source areas, in which the gate electrode structures may act as an efficient implantation mask. Thus, uniform process conditions may be ensured during the patterning of the sophisticated gate electrode structures, while the increased dopant concentration at the interface formed by the metal-containing electrode material portion and the semiconductor-based electrode material portion may result in superior electrical performance of the gate electrode structures.

One illustrative method disclosed herein comprises forming a gate insulation layer on a semiconductor region of a semiconductor device, wherein the gate insulation layer comprises a high-k dielectric material. The method further comprises forming an electrode material on the gate insulation layer by forming a metal-containing cap layer on the gate insulation layer and by depositing a doped semiconductor material above the metal-containing cap layer. Additionally, the method comprises forming a dielectric cap layer above the electrode material and forming a gate electrode structure from the gate insulation layer and the gate electrode material.

A further illustrative method disclosed herein relates to forming complementary transistors of a semiconductor device. The method comprises forming a doped semiconductor material above a first semiconductor region and a second semiconductor region, wherein the doped semiconductor material has the same conductivity type above the first and second semiconductor regions. The first and second semiconductor regions have formed thereon a gate insulation layer including a high-k dielectric material and a metal-containing cap layer. The method further comprises forming a first gate electrode structure on the first semiconductor region and a second gate electrode structure on the second semiconductor region at least from the doped semiconductor material, the gate insulation layer and the metal-containing cap layer. The method further comprises forming drain and source regions in the first and second semiconductor regions and forming a metal silicide in the drain and source regions and in the doped semiconductor material of the first and second gate electrode structures.

One illustrative semiconductor device disclosed herein comprises a first gate electrode structure formed on a first semiconductor region of a first one of two complementary transistors. The first gate electrode structure comprises a first gate insulation layer including a high-k dielectric material, a first metal-containing electrode material formed on the first gate insulation layer and a first doped semiconductor material that forms a first interface with the first metal-containing electrode material. The semiconductor device further comprises a second gate electrode structure formed on a second semiconductor region of a second one of the two complementary transistors. The second gate electrode structure comprises a second gate insulation layer including a high-k dielectric material, a second metal-containing electrode material formed on the second gate insulation layer, and a second doped semiconductor material that forms a second interface with the second metal-containing electrode material, wherein the first and second doped semiconductor materials have the same conductivity type at the first and the second interfaces.

BRIEF DESCRIPTION OF THE DRAWINGS

The disclosure may be understood by reference to the following description taken in conjunction with the accompanying drawings, in which like reference numerals identify like elements, and in which.

Figure 1A:
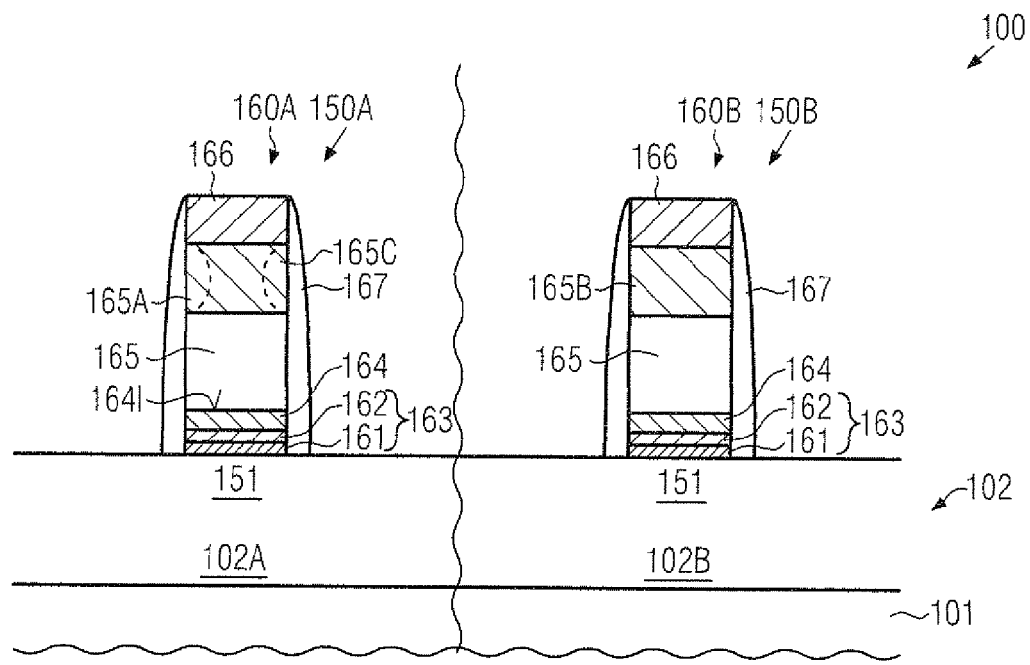
FIGS. 1a-1b schematically illustrate cross-sectional views of a semiconductor device during various manufacturing stages in forming complementary transistors on the basis of a high-k metal gate electrode structure whose work function may be adjusted in an early manufacturing stage, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, sophisticated high-k metal gate electrode structures may be formed on the basis of a process strategy in which the work function and, thus, threshold voltage of the transistors may be adjusted in an early manufacturing stage. To this end, an appropriately pre-doped semiconductor material, such as a silicon material, a silicon/germanium material, a germanium material and the like, may be applied on the metal-containing cap material, thereby achieving a desired high dopant concentration at the interface formed between the semiconductor material and the metal-containing cap material, which in turn may result in a superior electrical performance, for instance, in view of a superior high frequency behavior. In some illustrative embodiments, the doped semiconductor material may be formed with the same material composition in the gate electrode structures of complementary transistors, thereby providing a very uniform process sequence when patterning the gate layer stack, since substantially the same stack configuration may be obtained for P-channel transistors and N-channel transistors. On the other hand, an influence of the doped semiconductor material on the finally achieved work function may be efficiently reduced by selecting an appropriate thickness for the metal-containing cap material, which may thus, possibly in combination with additional metal species diffused into the gate insulation layer, determine the resulting work function and, thus, threshold voltage of the transistors, irrespective of the conductivity type of the overlying doped semiconductor material. Consequently, in combination with metal silicide formed in the doped semiconductor material, a superior conductivity of the gate electrode structures may be achieved, while at the same time patterning-related non-uniformities may be significantly reduced.

Moreover, in some illustrative embodiments disclosed herein, the additional amount of dopant species, which may be incorporated upon forming drain and source regions, may be reduced by preserving a dielectric cap material when forming at least a portion of the drain and source regions. Consequently, appropriate implantation energies may be used for forming the drain and source regions, while at the same time the basic dopant concentration in the predoped semiconductor material may be substantially not modified by the additional drain and source implantation species at the interface to the metal cap layer.

Figure 1B:
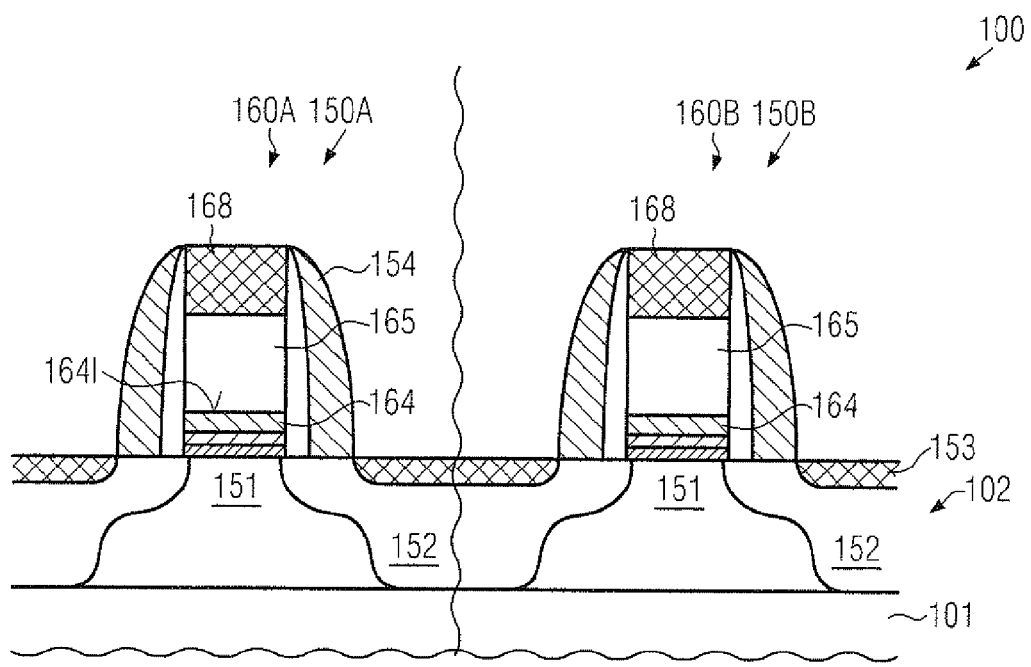

With reference to FIGS. 2a-2h, further illustrative embodiments will now be described in more detail, wherein reference may also be made to FIGS. 1a-1b, if appropriate.

Figure 2A:
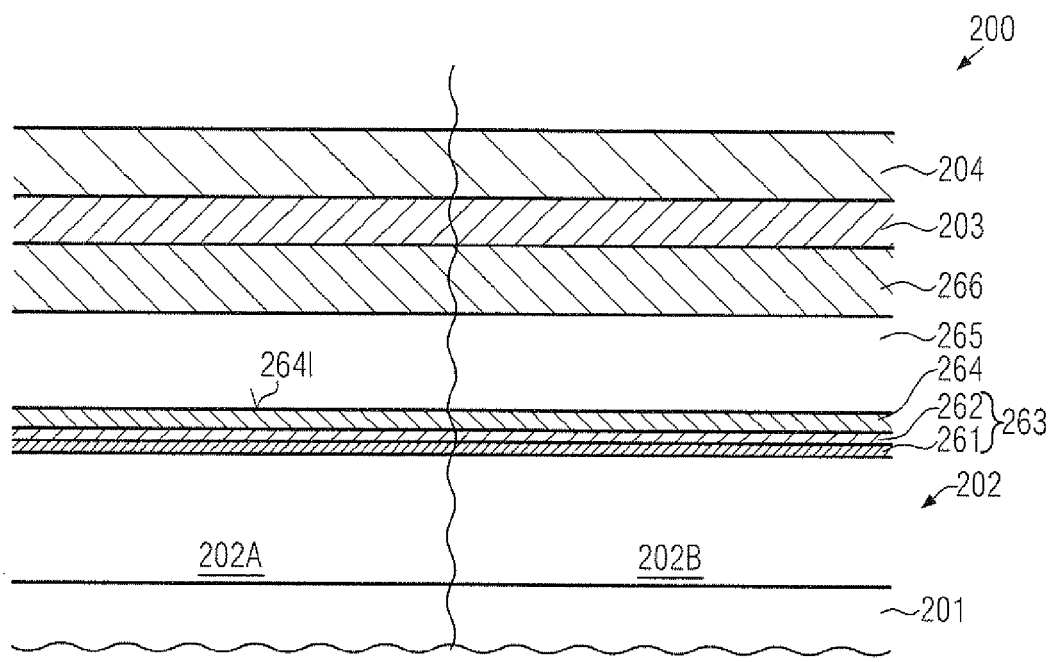
FIGS. 2a-2e schematically illustrate cross-sectional views of a semiconductor device during various manufacturing stages in forming complementary transistors with a sophisticated gate electrode structure on the basis of a predoped semiconductor material in order to enhance electrical performance of the gate electrode structures, according to illustrative embodiments.

FIG. 2a schematically illustrates a cross-sectional view of a semiconductor device 200 comprising a substrate 201, above which may be formed a semiconductor layer 202. The semiconductor layer 202, which may represent any appropriate semiconductor material, such as a silicon material, a silicon/germanium material, a germanium material and the like, may have formed therein semiconductor regions or active regions 202A, 202B, which may be laterally delineated by any appropriate isolation structures (not shown). The active regions 202A, 202B may represent transistors of the same conductivity type, such as N-channel transistors or P-channel transistors, possibly requiring different threshold voltages and the like. In some illustrative embodiments, the active regions 202A, 202B may represent the active regions of two complementary transistors, i.e., of an N-channel transistor and a P-channel transistor. Consequently, in this case, the active regions 202A, 202B may have incorporated therein different types of dopant species in order to establish the basic conductivity type, as required. Furthermore, in the manufacturing stage shown, a plurality of material layers may be formed on the active regions 202A, 202B; that is, a gate insulation layer 263 may be formed as a first layer on the active regions 202A, 202B and may represent any appropriate dielectric material that provides the desired leakage current behavior and capacitive coupling, as previously explained. In this sense, the gate insulation layer may be considered as comprising a high-k dielectric material, which may thus impart an increased dielectric constant to the gate insulation layer 263. For example, the layer 263 may comprise a first dielectric material 261, such as a silicon dioxide-based material, in combination with an actual high-k dielectric material 262, which may have a dielectric constant of 10.0 and significantly higher. It should be appreciated that the gate insulation layer 263 formed above the active region 202A may have a different configuration compared to a layer portion formed above the active region 202B, depending on the overall process strategy, as is also previously discussed with reference to the semiconductor device 100. For example, the gate insulation layer 263 may comprise different atomic species, in particular metal species in order to obtain appropriate fixed charges, which may result in a different effective work function for corresponding gate electrode structures to be formed on the basis of the gate insulation layer 263 and any subsequent layers, as is also previously discussed. In other illustrative embodiments, the gate insulation layer 263 may have substantially the same configuration for the active regions 202A, 202B, even if these active regions represent transistors of different conductivity type.

Furthermore, a metal-containing cap layer 264 may be formed on the gate insulation layer 263 and may include any appropriate metal species so as to adjust a threshold voltage for transistors to be formed in and above the active regions 202A, 202B. For example, the layer 264 may comprise an appropriate material layer or metal species in the form of aluminum, lanthanum and the like in order to obtain a desired work function, which results in a required threshold voltage for a transistor formed on the basis of the active region 202A. Similarly, the material 264 may comprise an appropriate metal species so as to obtain the desired work function, and thus threshold voltage, for a transistor to be formed in and above the active region 202B. As is also previously explained with reference to the semiconductor device 100, a corresponding difference in work function, and thus threshold voltage, may also be accomplished on the basis of a metal incorporated in the gate insulation layer 263 and, hence, the metal-containing layer 264 may have the same configuration above the active regions 202A and 202B. Moreover, the metal containing cap layer 264, which may be provided in the form of a titanium nitride material, or any other appropriate metal-containing material, may have an appropriate thickness so as to significantly reduce or suppress an influence of a semiconductor material 265 on the finally obtained work function and, thus, threshold voltage. For instance, depending on the overall device configuration, the material 264 may be provided with a thickness of approximately 5-20 nm. The semiconductor material 265, for instance provided in the form of a silicon material, a silicon/germanium material, a germanium material and the like, may have incorporated therein a dopant species, such as an N-type species or a P-type species, which may thus provide a desired high dopant concentration, at least at an interface 264I formed by the layers 264 and 265 in order to obtain a low Schottky barrier. In some illustrative embodiments, the dopant concentration in the material 265 may be substantially uniform, i.e., the dopant concentration may be the same in any unit volume across the layer 265, except for any process-related variations. For example, a substantially uniform distribution of the dopant concentration may be understood such that a difference of dopant concentration averaged over any sample volume of a size of several $\mu m^3$ may be less than 5%.

Furthermore, the dopant concentration at the interface 264I may be approximately $10^{19}$ per cm$^3$ to $10^{21}$ per cm$^3$, while it should be understood, however, that any other appropriate concentration values may be established, depending on the device requirements.

Moreover, a dielectric cap material 266, such as a silicon dioxide material, a silicon nitride material and the like, may be formed on the semiconductor material 265 and may have any appropriate thickness so as to act as an efficient hard mask material during the subsequent patterning process and also to act as an efficient capping material during the further processing, for instance when incorporating a strain-inducing semiconductor material in the active region 202A and/or 202B. Moreover, any appropriate hard mask material 203, such as an amorphous carbon material, may be provided in combination with a resist material 204.

The active regions 202A, 202B, the gate insulation layer 263 and the metal-containing cap layer 264 may be formed on the basis of any appropriate process strategy, as is, for instance, explained above with reference to the semiconductor device 100. Consequently, after adding the materials 263 and 264 and adjusting appropriate work function values in accordance with transistor elements to be formed in and above the active regions 202A, 202B, the semiconductor material 265 may be deposited, for instance on the basis of low pressure chemical vapor deposition (CVD) techniques, wherein an appropriate precursor material including a desired dopant species may be incorporated into the deposition ambient. Consequently, a desired degree of doping may be achieved on the basis of controlling the deposition ambient, which may be accomplished by using appropriate deposition recipes. Due to the nature of the deposition process, a high degree of uniformity of the dopant distribution within the material of the layer 265 may be obtained, thereby imparting uniform material characteristics, for instance with respect to a subsequently performed etch process, to the material 265. Next, the dielectric cap layer 266 may be deposited on the basis of any appropriate deposition technique, followed by the deposition of the material 203 and the resist material 204.

Figure 2B:
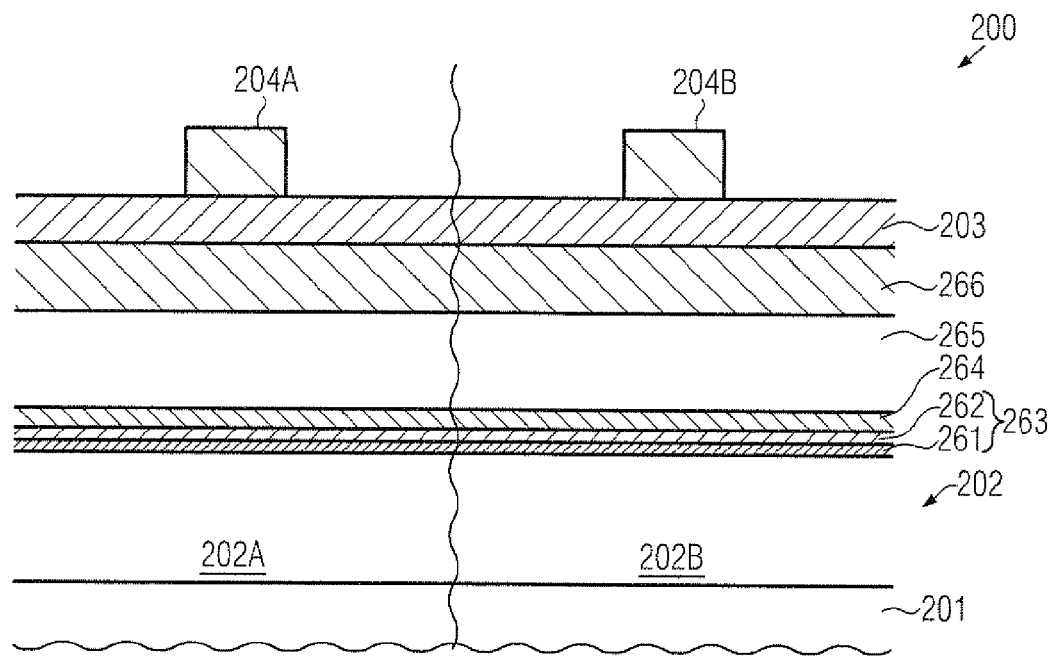

FIG. 2b schematically illustrates the semiconductor device 200 after patterning the resist material 204 of FIG. 2a, thereby obtaining mask features 204A, 204B, which may be used for patterning the hard mask material 203 and the dielectric cap layer 266 by using any appropriate anisotropic etch techniques. It should be appreciated that the mask features 204A, 204B may be obtained on the basis of sophisticated lithography techniques, possibly in combination with additional trim etch processes and the like. Consequently, upon patterning the layers 203, 266, the further etch process may be continued by applying an appropriate etch chemistry for etching through the doped semiconductor material 265, wherein, in some illustrative embodiments, the high degree of uniformity of material characteristics may result in a substantially constant "gate length," since a lateral etch rate may be substantially constant across the entire thickness of the material 265, as is also previously explained with reference to the semiconductor device 100. Consequently, the corresponding etch recipe may be adjusted so as to obtain the desired gate length, which may be substantially identical above the active regions 202A and 202B due to the various similar characteristics of the corresponding layer stack.

Figure 2C:
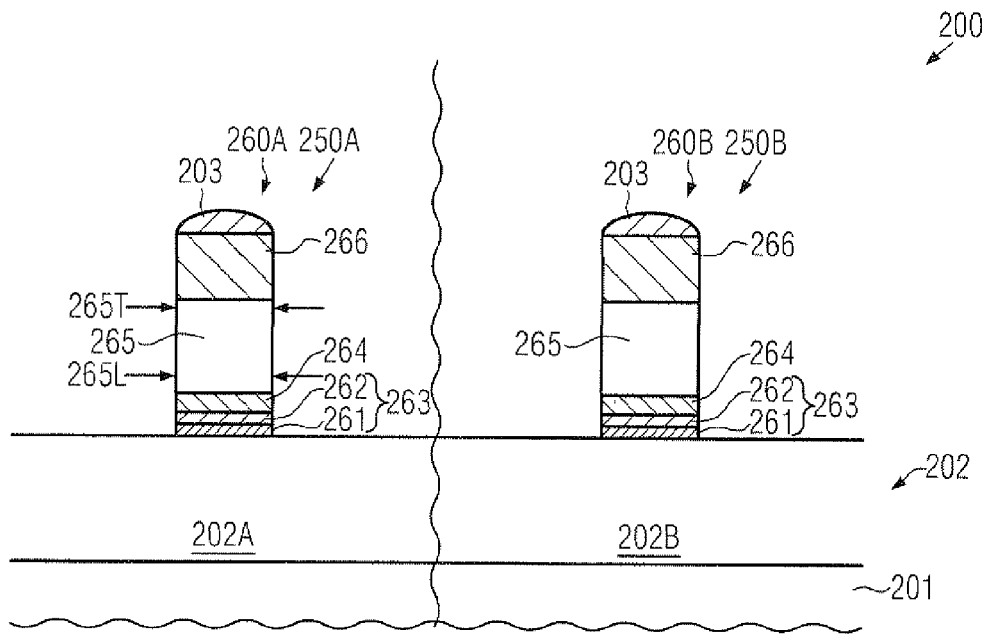

FIG. 2c schematically illustrates a first gate electrode structure 260A formed on the active region 202A and a second gate electrode structure 260B formed on the active region 202B. The gate electrode structures 260A, 260B may comprise the gate insulation layer 263 and the conductive cap material 264 followed by the doped semiconductor material 265 and the dielectric cap layer 266. Furthermore, residues of the material 203 may still be present. As previously discussed, in some illustrative embodiments, when the gate electrode structures 260A, 260B represent the gate electrode structures of transistors that differ in conductivity type or at least in threshold voltage, the layers 263 and/or 264 may be different in the gate electrode structure 260A and the gate electrode structure 260B. On the other hand, the gate electrode structures 260A, 260B may have a substantially identical geometric configuration, which may mainly be caused by the identical configuration of the semiconductor material 265. Moreover, in the embodiment shown, the patterning process may have been performed on the basis of process parameters so as to obtain a length of the semiconductor material 265, which may be substantially determined by the cap material 266 and the hard mask material 203, so that any significant lateral etch rate has been suppressed upon patterning the semiconductor material 265. Furthermore, due to the uniform characteristics of the material 265, a gate length at a top of the material 265, indicated by 265T, may be substantially the same as a length 265L at the bottom of the material 265. It should be appreciated that a substantially identical gate length at the top and bottom of the material 265 are to be understood such that the values 265T and 265L differ from each other by 5 nm or less. It should be appreciated, however, that, in other illustrative embodiments (not shown), any other appropriate cross-sectional shape may be obtained, if considered appropriate, wherein, also in this case, the uniform material characteristics of the semiconductor material 265 may result in very similar configurations for the gate electrode structures 260A and 260B.

Figure 2D:
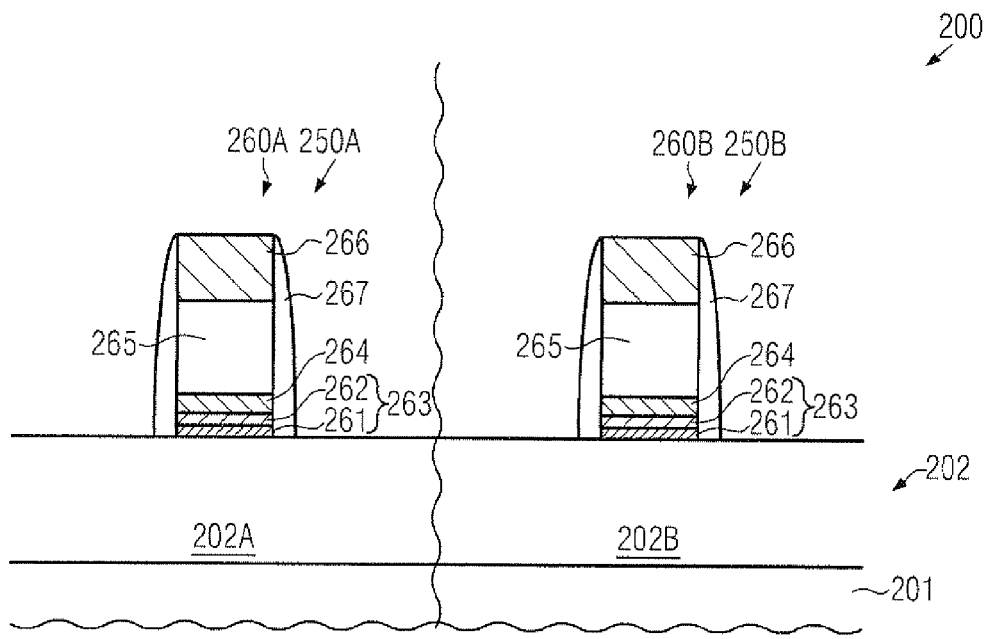

FIG. 2d schematically illustrates the semiconductor device 200 in a further advanced manufacturing stage. As illustrated, the hard mask material 203 of FIG. 2c has been removed and a dielectric spacer element 267 is formed on side walls of the materials 266, 265, 264 and 263. For this purpose, any appropriate dielectric material, such as silicon nitride and the like, may be used, wherein well-established deposition and etch techniques may be applied for forming the spacers 267. Thereafter, the processing may be continued on the basis of any appropriate process strategy, as is also for instance described above with reference to the semiconductor device 100. That is, the dielectric cap material 266 may be removed and drain and source regions may be formed on the basis of appropriate sidewall spacer structures, as discussed above. In other cases, the dielectric cap layer of at least one of the gate electrode structures 260A, 260B may be used as a mask in combination with the spacer elements 267 in order to incorporate a strain-inducing semiconductor material in one or both of the active regions 202A, 202B in order to create a desired strain component therein, which may, thus, enhance performance of one or both of the transistors still to be formed.

Figure 2E:
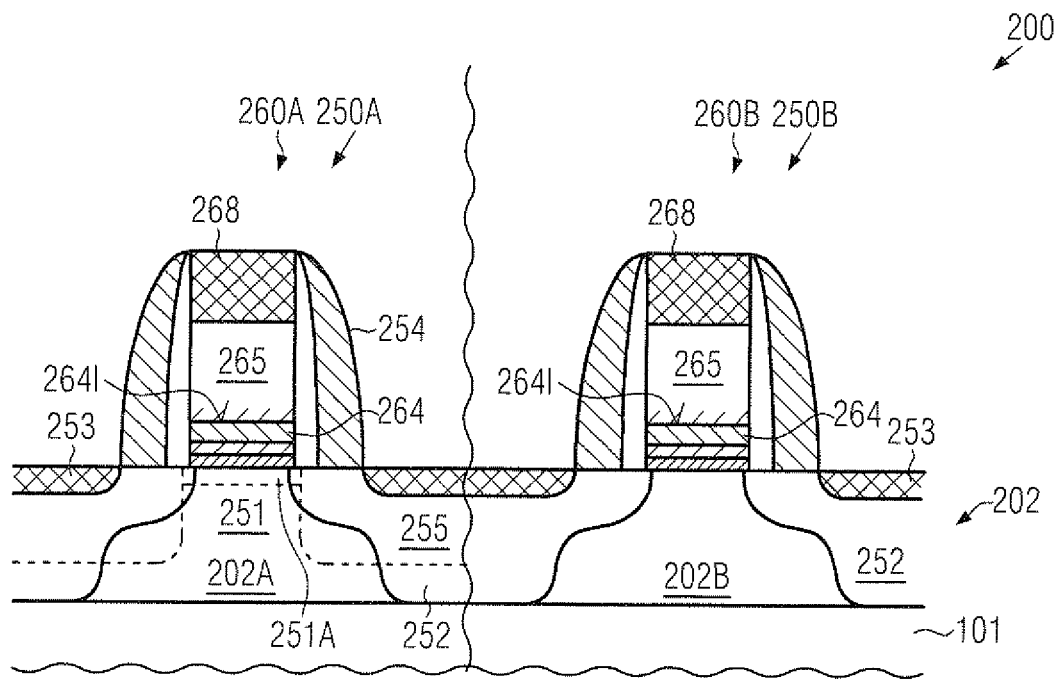

FIG. 2e schematically illustrates the semiconductor device 200 in a further advanced manufacturing stage. A first transistor 250A may be formed in and above the active region 202A and may comprise the gate electrode structure 260A. Similarly, a second transistor 250B may be formed in and above the active region 202B and may comprise the gate electrode structure 260B. As previously discussed, in some illustrative embodiments, the transistors 250A, 250B may represent complementary transistors, wherein, for instance, the transistor 250A may represent a P-channel transistor. The transistors 250A, 250B may comprise drain and source regions 252, which may be of inverse conductivity type, when the transistors 250A, 250B represent complementary transistors. Furthermore, metal silicide regions 253 may be provided in the drain and source regions 252. In some illustrative embodiments, one or both of the transistors 250A, 250B may have incorporated in the corresponding active region a strain-inducing semiconductor material, as indicated as 255 for the transistor 250A, in order to obtain a desired strain component in a channel region 251. For example, a silicon/germanium may be advantageously used in inducing a compressive strain component. It should be appreciated, however, that any other semiconductor material may be used which may be capable of producing the desired strain component. Moreover, in some illustrative embodiments, the channel region 251 may have formed therein an additional semiconductor material, as indicated by 251A, which may be required for adjusting a desired band gap offset with respect to the work function of the gate electrode structure 260A. For example, if required, a silicon/germanium alloy may be provided in the channel region 251 in order to appropriately adjust the threshold voltage of the transistor 250A.

Moreover, the transistors 250A, 250B may comprise a sidewall spacer structure 254, which may be used for forming the metal silicide regions 253 and for appropriately determining the lateral and vertical dopant profile of the drain and source regions 252. Moreover, the gate electrode structures 260A, 260B may comprise a metal silicide material 268 formed in a portion of the doped semiconductor material 265. Furthermore, as previously explained, at the interface 264I of gate electrode structure 260A, a desired high dopant concentration may still be present in order to reduce the Schottky barrier between the semiconductor material 265 and the metal-containing material 264. Similarly, a desired high dopant concentration may be present at the interface 264I in the gate electrode structure 260B, wherein the semiconductor material 265 may have the same conductivity type at these interfaces 264I, since the concentration of any additional dopant species incorporated during the formation of the drain and source regions 252 may be less compared to the initial predoping of the material 265. Consequently, superior electrical performance of the gate electrode structures 260A, 260B may be achieved, while at the same time patterning-related non-uniformities may be significantly suppressed.

It should be appreciated that the transistors 250A, 250B may be formed in accordance with any appropriate process strategy, as is also previously explained with reference to the device 100.

Figure 2F:
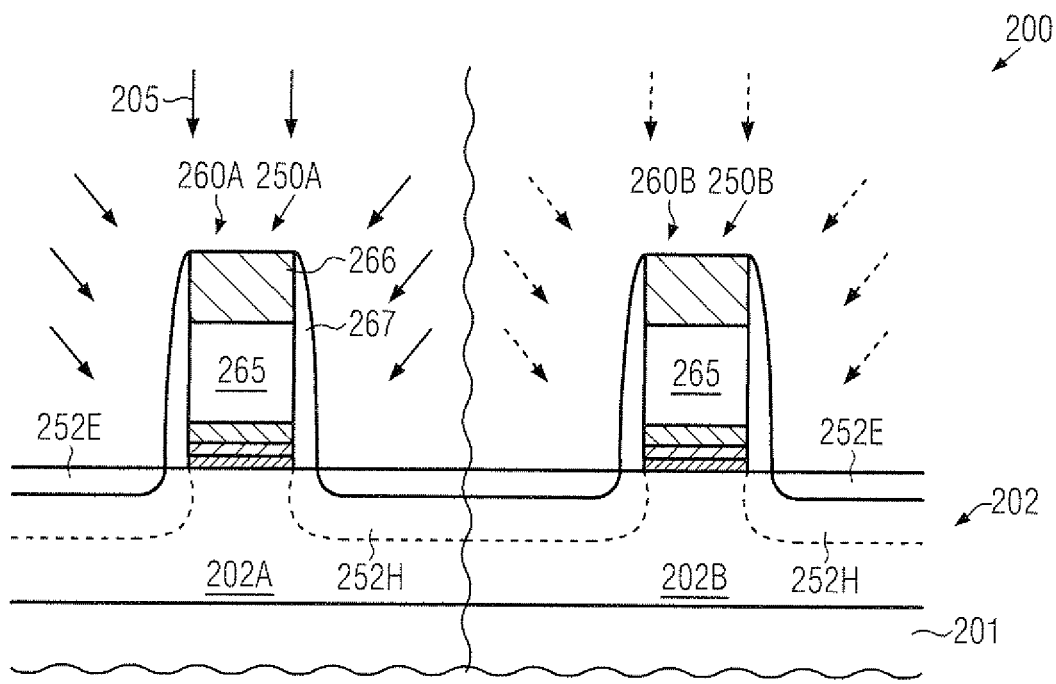
FIGS. 2f-2h schematically illustrate cross-sectional views of the semiconductor device during various manufacturing stages, in which a desired high dopant concentration may be obtained with superior process margins during subsequent implantation processes, according to further illustrative embodiments.

FIG. 2f schematically illustrates the semiconductor device 200 according to further illustrative embodiments, in which the incorporation of additional dopant species into the doped semiconductor material of the gate electrode structures 260A, 260B may be reduced. As shown, drain and source extension regions 252E and counter-doped regions or halo regions 252H may be formed in the active regions 202A, 202B on the basis of an appropriate process sequence 205 including a plurality of implantation steps and corresponding lithography processes for providing appropriate implantation masks. Moreover, the dielectric cap layers 266 may still be present in the gate electrode structures 260A, 260B, so that, upon forming the drain and source extension regions 252E, the ion blocking effect of the dielectric cap layer 266 may substantially avoid the incorporation of a dopant species. Moreover, the halo regions 252H may be formed on the basis of increased implantation energies, thereby achieving the desired penetration depth, wherein the ion blocking effect of the dielectric cap layer 266 may reduce undue dopant incorporation into the material 265, wherein, however, generally, the implantation dose of the halo implantation step may be significantly less compared to the implantation for producing the drain and source extension regions 252E.

After the process sequence 205, further processing may be continued by removing the dielectric cap layer 266 and forming drain and source regions, as previously discussed.

Figure 2G:
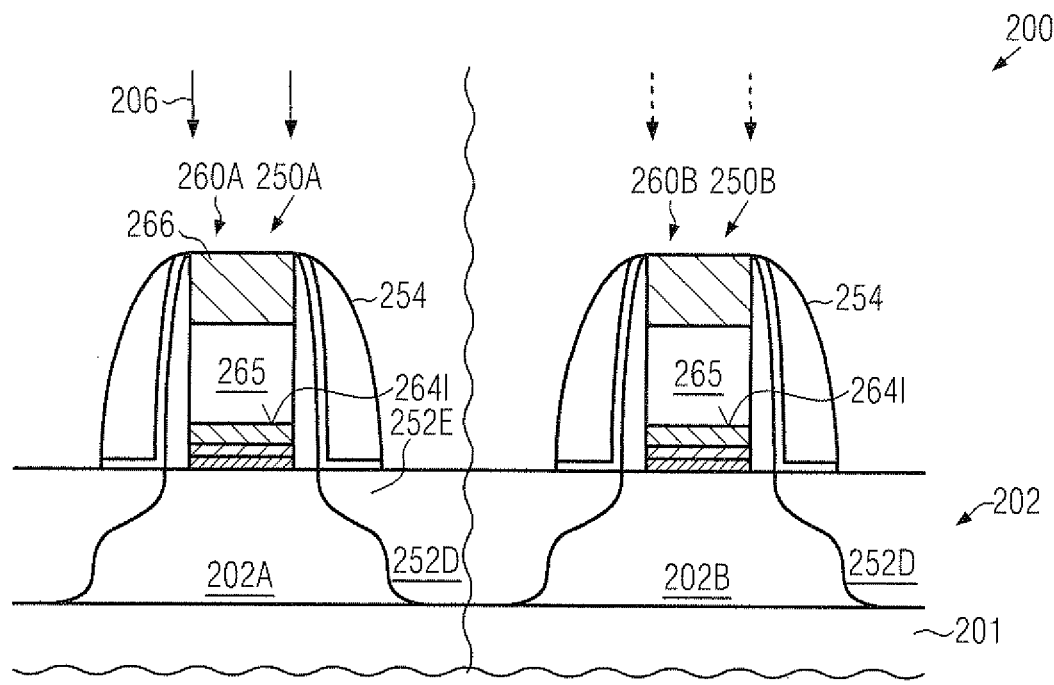

FIG. 2g schematically illustrates the semiconductor device 200 according to still further illustrative embodiments, in which the sidewall spacer structure 254 may be formed in the presence of the dielectric cap material 266. Consequently, upon performing the process sequence 206 for incorporating the dopant species for deep drain and source areas 252D, the gate electrode structures 260A, 260B may have an increased ion blocking effect due to the presence of the dielectric cap layer 266, which, thus, increases the effective height of the gate electrode structures 260A, 260B, and of the spacer structure 254. Hence, the incorporation of additional dopant species into the material 265 and in particular in the vicinity of the interfaces 264I may be reduced, which may, in some cases, result in a certain degree of counter doping for one of the gate electrode structures 260A, 260B with respect to the initial predoping of the material 265. Thus, a moderately high initial dopant concentration may be preserved at the interfaces 264I, irrespective of the conductivity type of the corresponding implantation species incorporated during the process sequence 206.

Figure 2H:
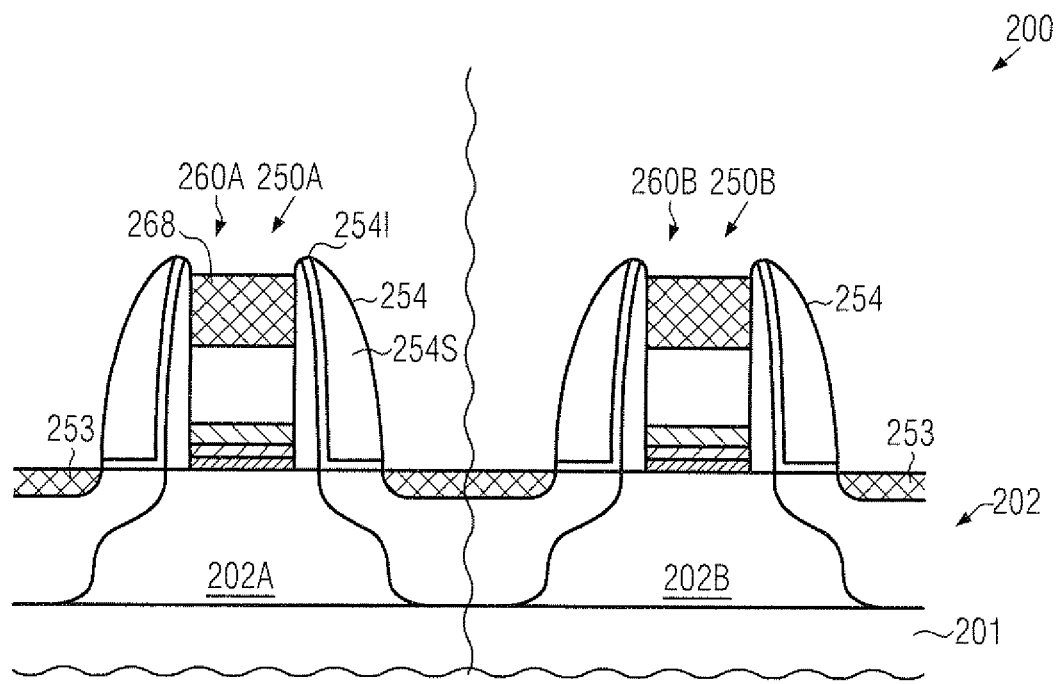

FIG. 2h schematically illustrates the semiconductor device 200 in a further advanced manufacturing stage, in which the dielectric cap layer 266 (FIG. 2g) has been removed prior to forming the metal silicide materials 268 and 253. For this purpose, an etch strategy may be applied in which the cap material 266 may be removed selectively with respect to the spacer structure 254, which may be accomplished by providing these components with different material compositions, such as silicon nitride, for instance, for the cap material 266, and silicon dioxide for the spacer structure 254, or vice versa. In other illustrative embodiments, the spacer structure 254 may comprise a liner material 254I and spacer element 254S formed of different materials, wherein at least the liner material 254I may be preserved during any precleaning processes that typically precede the formation of the metal silicide materials 268 and 253, which may typically remove oxide material. Thus, even if a spacer element 254S may be formed on the basis of silicon dioxide so as to act as an etch stop material during the removal of a silicon nitride-based cap layer 266, the liner 254I may, nevertheless, ensure an appropriate lateral offset of the metal silicide regions 253. For example, the liners 254I may be comprised of silicon nitride, which may exhibit a high degree of etch selectivity with respect to any precleaning processes that may be used prior to forming the metal silicide materials 268 and 253.

As a result, the present disclosure provides semiconductor devices and manufacturing techniques in which an appropriately doped semiconductor material may be formed on a conductive cap material of a sophisticated high-k metal gate electrode structure, thereby reducing the Schottky barrier, while at the same time superior uniformity during the patterning sequence may be achieved. In some illustrative embodiments, the predoped semiconductor material may be applied for the gate electrode structures of complementary transistors, thereby also achieving a high degree of pattern uniformity with the gate electrode structures of the complementary transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming complementary transistors of a semiconductor device, the method comprising:
    forming a doped semiconductor material above a first semiconductor region and a second semiconductor region, said doped semiconductor material having the same conductivity type above said first and second semiconductor regions, said first and second semiconductor regions having formed thereon a gate insulation layer including a high-k dielectric material and a metal-containing cap layer formed below said doped semiconductor material;
    forming a dielectric cap layer above said doped semiconductor material;
    forming a first gate electrode structure of a first transistor of a first conductivity type above said first semiconductor region and a second gate electrode structure of a second transistor having a second conductivity type different from said first conductivity type above said second semiconductor region at least from said dielectric cap layer, said doped semiconductor material, said metal-containing cap layer and said gate insulation layer;
    forming at least drain and source extension regions in said first and second semiconductor regions prior to removing said dielectric cap layer from said first and second gate electrode structures; and
    after removing said dielectric cap layers, forming a metal silicide in said drain and source regions and in said doped semiconductor material of said first and second gate electrode structures.

2. The method of claim 1, wherein forming said doped semiconductor material comprises depositing said semiconductor material with a substantially uniform dopant distribution.

3. The method of claim 1, further comprising adjusting a first threshold voltage of a first one of said complementary transistors and adjusting a second threshold voltage of a second one of said complementary transistors on the basis of at least one of said gate insulation layer and said metal-containing cap layer prior to forming said first and second gate electrode structures.

4. The method of claim 3, wherein adjusting said first and second threshold voltages on the basis of said gate insulation layer comprises diffusing a metal species into said gate insulation layer.

5. The method of claim 3, wherein adjusting said first and second threshold voltages on the basis of said metal-containing cap layer comprises adjusting a thickness of said metal containing cap layer.

6. The method of claim 1, wherein forming said doped semiconductor material comprises depositing said semiconductor material with a substantially non-uniform dopant distribution such that a greatest concentration of said dopant is at an interface between said doped semiconductor material and said metal-containing cap layer.

7. The method of claim 6, wherein said dopant concentration at said interface is in the range of approximately $10^{19}$ to $10^{21}$ atoms per $cm^3$.

8. A method of forming complementary transistors of a semiconductor device, the method comprising:
    forming a doped semiconductor material above a first semiconductor region and a second semiconductor region, said doped semiconductor material having the same conductivity type above said first and second semiconductor regions, said first and second semiconductor regions having formed thereon a gate insulation layer including a high-k dielectric material and a metal-containing cap layer formed below said doped semiconductor material;
    forming a dielectric cap layer above said doped semiconductor material;
    forming a first gate electrode structure of a first transistor of a first conductivity type above said first semiconductor region and a second gate electrode structure of a second transistor having a second conductivity type different from said first conductivity type above said second semiconductor region at least from said dielectric cap layer, said doped semiconductor material, said metal-containing cap layer and said gate insulation layer;
    forming at least deep drain and source regions in said first and second semiconductor regions prior to removing said dielectric cap layer from said first and second gate electrode structures; and
    after removing said dielectric cap layers, forming a metal silicide in said drain and source regions and in said doped semiconductor material of said first and second gate electrode structures.

9. The method of claim 8, wherein forming said doped semiconductor material comprises depositing said semiconductor material with a substantially uniform dopant distribution.

10. The method of claim 8, further comprising adjusting a first threshold voltage of a first one of said complementary transistors and adjusting a second threshold voltage of a second one of said complementary transistors on the basis of at least one of said gate insulation layer and said metal-containing cap layer prior to forming said first and second gate electrode structures.

11. The method of claim 10, wherein adjusting said first and second threshold voltages on the basis of said gate insulation layer comprises diffusing a metal species into said gate insulation layer.

12. The method of claim 10, wherein adjusting said first and second threshold voltages on the basis of said metal-containing cap layer comprises adjusting a thickness of said metal containing cap layer.

13. The method of claim 8, wherein forming said doped semiconductor material comprises depositing said semiconductor material with a substantially non-uniform dopant distribution such that a greatest concentration of said dopant is at an interface between said doped semiconductor material and said metal-containing cap layer.

14. The method of claim 13, wherein said dopant concentration at said interface is in the range of approximately $10^{19}$ to $10^{21}$ atoms per $cm^3$.

15. A method, comprising:
forming a first gate electrode structure of a first transistor of a first conductivity type above a first semiconductor region of a semiconductor device;
forming a second gate electrode structure of a second transistor having a second conductivity type different from said first conductivity type above a second semiconductor region of said semiconductor device, each of said first and second gate electrode structures comprising a gate insulation layer comprising a high-k dielectric material formed above said respective first and second semiconductor regions, metal-containing cap layer formed above said respective gate insulation layers, and a doped semiconductor material formed above said respective metal-containing cap layers, wherein a conductivity type of said doped semiconductor material in said first gate electrode structure is the same as a conductivity type of said doped semiconductor in said second gate electrode;
forming a dielectric cap layer above each of said first and second gate electrode structures;
using said dielectric cap layers as an implantation mask while performing at least one source/drain implantation process in each of said first and second semiconductor regions;
removing said dielectric cap layers from above said first and second gate electrode structures; and
forming a metal silicide in said drain and source regions and in said doped semiconductor material of said first and second gate electrode structures.

16. The method of claim 15, wherein a dopant distribution in said doped semiconductor material in said first gate electrode structure is substantially the same as a dopant distribution in said doped semiconductor material in said second gate electrode structure.

17. The method of claim 15, wherein a dopant distribution in said doped semiconductor material in each of said first and second gate electrode structures is substantially uniform.

18. The method of claim 15, wherein a dopant distribution in said doped semiconductor material in each of said first and second gate electrode structures is substantially non-uniform and a greatest concentration of said dopant is at an interface between said doped semiconductor material and said metal-containing cap layer.

19. The method of claim 15, further comprising adjusting a threshold voltage of at least one of said first and second transistors by at least one of diffusing a metal species into said gate insulation layer and adjusting a thickness of said metal-containing cap layer.

20. The method of claim 15, wherein performing said at least one source/drain implantation process in each of said first and second semiconductor regions comprises forming at least one of drain and source extension regions and deep drain and source regions.

* * * * *